(12) United States Patent
Godard et al.

(10) Patent No.: US 9,396,944 B2
(45) Date of Patent: Jul. 19, 2016

(54) METHOD AND APPARATUS FOR FORMING A STRAIGHT LINE PROJECTION ON A SEMICONDUCTOR SUBSTRATE

(75) Inventors: Bruno Godard, Les Ulis (FR); Jean-Blaise Migozzi, Sevres (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 196 days.

(21) Appl. No.: 14/007,953

(22) PCT Filed: Mar. 28, 2012

(86) PCT No.: PCT/EP2012/055501
§ 371 (c)(1),
(2), (4) Date: Dec. 2, 2013

(87) PCT Pub. No.: WO2012/130875
PCT Pub. Date: Oct. 4, 2012

(65) Prior Publication Data
US 2014/0080323 A1    Mar. 20, 2014

(30) Foreign Application Priority Data
Mar. 28, 2011   (EP) .................................... 11290155

(51) Int. Cl.
| | | |
|---|---|---|
| H01L 21/00 | (2006.01) | |
| H01L 21/02 | (2006.01) | |
| G02B 19/00 | (2006.01) | |
| B23K 26/00 | (2014.01) | |
| H01L 21/268 | (2006.01) | |

(52) U.S. Cl.
CPC ...... *H01L 21/02691* (2013.01); *B23K 26/0006* (2013.01); *B23K 26/0081* (2013.01); *G02B 19/0023* (2013.01); *G02B 19/0028* (2013.01); *G02B 19/0047* (2013.01); *B23K 2203/56* (2015.10); *H01L 21/268* (2013.01)

(58) Field of Classification Search
CPC .................................................... B23K 26/0643
See application file for complete search history.

(56) References Cited

U.S. PATENT DOCUMENTS

| | | | | |
|---|---|---|---|---|
| 5,083,035 A | * | 1/1992 | Pecen | G01N 21/94 250/559.18 |
| 5,754,328 A | * | 5/1998 | Cobb | G02B 26/105 347/256 |
| 6,502,319 B1 | | 1/2003 | Goodrich et al. | |
| 7,253,376 B2 | | 8/2007 | Zhang et al. | |
| 2010/0227261 A1 | * | 9/2010 | Shiraishi | G03F 1/14 430/5 |

FOREIGN PATENT DOCUMENTS

| | | |
|---|---|---|
| JP | 06-145000 | 5/1994 |
| WO | WO 01/73769 | 10/2001 |

* cited by examiner

*Primary Examiner* — Angel Roman
(74) *Attorney, Agent, or Firm* — Young & Thompson

(57) ABSTRACT

An apparatus for irradiating a semiconductor is disclosed. The apparatus has a curved mirror with a reflective surface of revolution, and a point source generating an irradiation beam being incident on the curved mirror along an incident direction. The curved mirror and the point source form a system having an axis of revolution wherein the point source is provided on or near said axis of revolution. The axis of revolution substantially coincides with a straight line projection to be generated on a semiconductor substrate. Additionally, the use of such an apparatus for manufacturing a selective emitter grid, or for irradiating a large area semiconductor surface in a scanning movement, is disclosed.

20 Claims, 5 Drawing Sheets

METHOD AND APPARATUS FOR FORMING A STRAIGHT LINE PROJECTION ON A SEMICONDUCTOR SUBSTRATE

This Application is the U.S. National Phase of International Application Number PCT/GB2012/055501 filed on Mar. 28, 2012, which claims priority to European Patent Application No. 11290155.8 filed on Mar. 28, 2011.

FIELD OF THE INVENTION

The present invention relates to an apparatus for irradiating a semiconductor substrate comprising a curved mirror with a reflective surface of revolution. Further the invention relates to the use of such apparatus for manufacturing a selective emitter grid, or for irradiating a large area semiconductor surface in a scanning movement.

BACKGROUND OF THE INVENTION

Laser irradiation of semiconductor material surfaces is well known for applications such as thermal annealing of amorphous silicon to obtain re-crystallization, and dopant activation. This technique offers significant advantages over a conventional heating process by enabling a very fast heat treatment and shallow depth of the heated region.

Since the shape and/or size of the irradiation beam spot usually does not fit to the shape and/or size of the region to be irradiated, the state of the art provides a number of means for shaping the laser such that a region of a semiconductor material layer with particular size and shape or a pattern of such separated regions can be irradiated.

Such particular shape having a number of interesting applications is a straight line shape. An irradiation beam shaped to a straight line projection can be used obviously for irradiating a straight line shaped regions of a semiconductor surface, but also for irradiating a large area of a semiconductor substrate by combining the line shape with a scanning movement. This combination of a straight line shape and a scanning movement for large area irradiation is advantageous since, compared to irradiating step by step, irradiation speed increases, production cost decreased. Moreover, when using a continuous layer, overlapping effects decrease and process uniformity increases.

Conventional optical systems for generating a straight line projection from an irradiation source are known but suffer from a number of drawbacks. For example, an optical system with cylindrical lenses have the disadvantage that, given the small width of the straight line projection to be used in a number of applications and the divergence of the laser, one is forced to position the lenses very close to the semiconductor substrate, causing a risk of damaging the lenses by semiconductor material sputtering.

In another conventional optical system for generating a straight line projection diffractive elements are used. These have the disadvantage that, given the laser bandwidth being relatively large, it is not easy to obtain the desired line width. Additionally, the life time of such diffractive elements under high energy laser irradiation may be decreased.

Another example of a state of the art apparatus is described in JP6145000, wherein a linear irradiation source is reflected via a curved mirror on a semiconductor surface forming a straight line projection parallel with the transverse direction of the semiconductor layer to be irradiated and scanning over the surface in order to recrystallize the semiconductor layer.

An obvious disadvantage of this technique however is that the irradiation source itself is linear and that such system is therefore not compatible with point sources, such as for example laser sources, while it is known, as written above, that laser sources are highly efficient for annealing, recrystallization, dopant activation, etc.

Another disadvantage is that, in order to irradiate a number of separated parallel line shaped regions on a semiconductor substrate, the optical system has to make a stepping movement, resulting in production inefficiency and high production cost.

Considering the above drawbacks, it is an object of the present invention to provide an apparatus adapted to irradiate a straight line shaped region of a semiconductor substrate by means of a point source.

It is another object of the present invention to provide an apparatus with an optical system having minimized risk of damaging optical elements by semiconductor material sputtering and having an acceptable lifetime.

Another object of the present invention is to provide an apparatus having the ability to simultaneously generate multiple separated parallel straight line projections.

Still another object of the present invention is to provide an apparatus having the ability to irradiate a large-area semiconductor substrate, e.g. in photovoltaics, at high production speed an in a cost efficient way.

Further, as another object, the present invention provides an apparatus having the ability to tune the line length and line width as desired.

The present invention meets the above objects by providing an apparatus comprises a curved mirror and a point source, wherein the curved mirror and the point source form a system having an axis of revolution wherein the point source is provided on or near said axis of revolution, and wherein said axis of revolution substantially coincides with a straight line projection to be generated on a semiconductor substrate.

SUMMARY OF THE INVENTION

The present invention is directed to an apparatus for irradiating a semiconductor comprising:

a) a curved mirror with a reflective surface of revolution, and b) a point source generating an irradiation beam being incident on the curved mirror along an incident direction, characterized in that the curved mirror and the point source form a system having an axis of revolution wherein the point source is provided on or near said axis of revolution, and that said axis of revolution substantially coincides with a straight line projection to be generated on a semiconductor substrate.

Additionally, the present invention is directed to the use of such apparatus for manufacturing a selective emitter grid, or for irradiating a large area semiconductor surface in a scanning movement.

DESCRIPTION OF THE INVENTION

Figure 1:
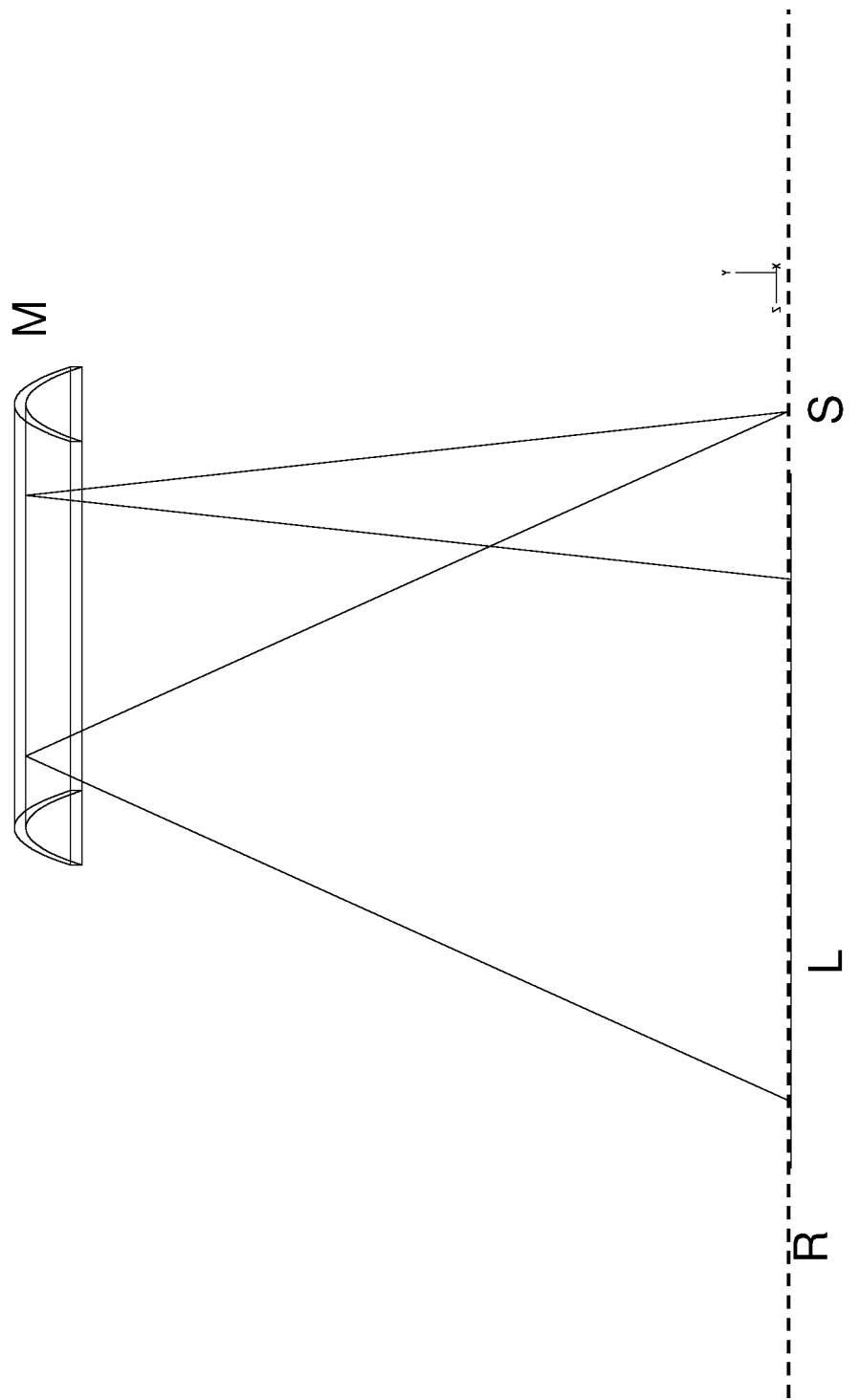
FIGS. 1 to 5 illustrate embodiments of an apparatus in accordance with the present invention.

In an embodiment in accordance with the present invention and as illustrated in FIG. 1, an apparatus for irradiating a semiconductor substrate is provided comprising:

a) a curved mirror (M) with a reflective surface of revolution, and b) a point source (S) generating an irradiation beam being incident on the curved mirror along an incident direction, characterized in that the curved mirror and the point source form a system having an axis of revolution (R) wherein the point source is provided on or near said axis of revolution, and that said axis of revolution substantially coincides with a straight line projection (L) to be generated on a semiconductor substrate.

By positioning the point source and curved mirror such that they form a system having an axis of revolution wherein the point source is provided on or near said axis of revolution, and by positioning that system such that its axis of revolution substantially coincides with the straight line projection to be generated, a straight line shaped region of the semiconductor substrate may irradiated by means of a point source, resulting in annealing, recrystallization, and dopant activation steps with improved efficiency.

A further advantage of such apparatus is that, due to the fact that the curved mirror is not positioned very close to the semiconductor substrate, the optical system may be exposed to minimized risk of damaging optical elements by semiconductor material sputtering, leading to improved lifetime.

In the context of the present invention, the point source may be any point source suitable for irradiating a semiconductor substrate, such as for example a Light Emitting Diode (LED), a laser diode, or any laser whose wavelength, energy and pulse duration is adapted to the process, such as solid state lasers, or excimer lasers. Preferably, the point source may be an excimer layer, more preferably a xenon chloride excimer laser.

The wavelength of the point source may be in the range 190 nm to 600 nm, 190 nm to 550 nm, 190 nm to 480 nm due to the high energy absorption of silicon at those wavelengths, and preferably 308 nm.

The irradiation energy may be in the range of 1 Joules to 25 Joules. In order to achieve these energies, the laser discharge volume is optimized to typically 10 cm (inter electrodes spacing)×7 to 10 cm (discharge width)×100 to 200 cm (discharge length).

In an embodiment of the present invention, the irradiation source may be adapted to produce a irradiation beam with an energy density between 0.1 and 10 $J/cm^2$, preferably between 1 and 10 $J/cm^2$, most preferably between 1 to 5 Joules/$cm^2$.

The irradiation beam may be continuous or pulsed, preferably having a pulse duration in the range of 100 ns to 1000 ns, or between 100 ns and 300 ns, or preferably between 100 and 200 nanoseconds.

In a preferred embodiment of the present invention, the point source may be an excimer laser having a wavelength of 308 nm, a pulse duration between 100 and 200 nanoseconds and a projected irradiation beam energy density between 1 and 5 $J/cm^2$.

An apparatus in accordance with the present invention having the appropriate point source for generating the straight line projection and having means for irradiating the semiconductor substrate with a scanning movement, may have the ability to irradiate a large-area semiconductor substrate, e.g. in photovoltaics, at high production speed an in a cost efficient way.

In an embodiment in accordance with the present invention, the straight line projection to be generated may have a specific length and the normal to the center point of the reflective surface of revolution may form an angle with the incident direction of the irradiation beam on the curved mirror, wherein the angle may be selected such that the irradiation beam is projected on the semiconductor substrate forming the straight line projection having said specific length.

By varying the angle between the normal to the center point of the reflective surface of revolution and the incident direction of the irradiation beam on the curved mirror, length of the straight line projection may be tuned desired.

Alternatively or in combination with varying the angle, also the size of the reflective surface of revolution can be adapted to the length of the straight line projection.

In accordance with the present invention, the curved mirror may be convex, but preferably concave. A person skilled in the art will understood that, upon using a concave mirror, the irradiation beam from the point source will be substantially completely projected on the semiconductor substrate, whereas upon using a suitable convex mirror, only a small part of the irradiation beam will be projected on the semiconductor substrate, the other part will be scattered into the environment.

The concave mirror may be for example cylindrical, conical or spherical.

Since a cylindrical or conical mirror only has one axis of revolution, the point source has to be provided on that axis of revolution, such that it forms together with the mirror a system equally having that axis of revolution. This axis of revolution has to coincide with the desired straight line projection on the semiconductor substrate.

Since a spherical mirror has an infinite number of axes of revolution intersecting the fictional sphere's center point, the point source is inevitably provided on one of these axes of revolution. Consequently, the location of the point source defines the axis of revolution of the system. This axis of revolution has to coincide with the desired straight line projection on the semiconductor substrate.

Figure 2:
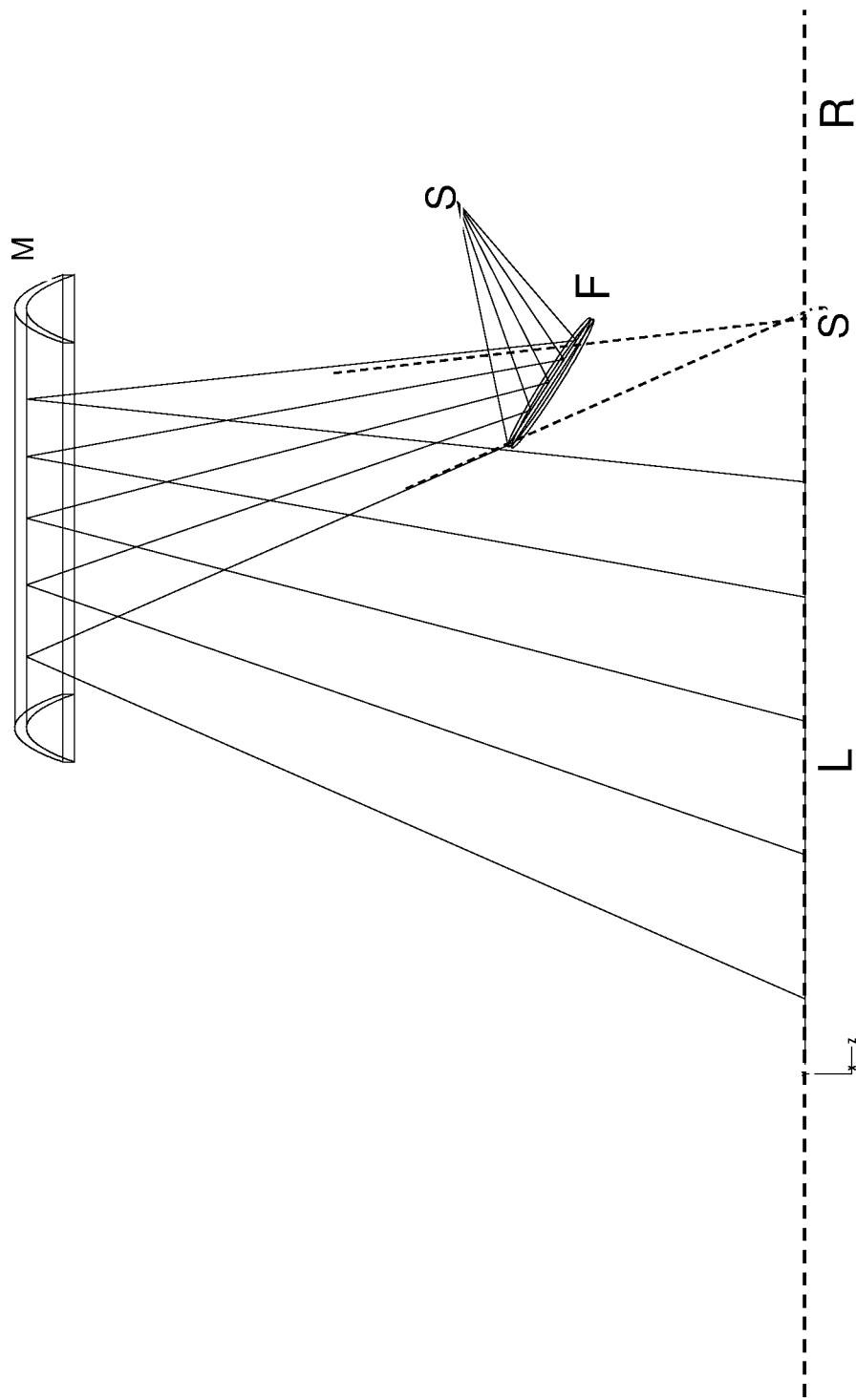

In a further embodiment in accordance with the present invention and as illustrated in FIG. 2, the apparatus may additionally comprise a folding mirror (F) for projecting the point source on or near the axis of revolution. Such folding mirror makes it possible to provide the point source (S') on or near the axis of revolution while the point source (S) itself is positioned somewhere else, thereby avoiding that the point source has to be positioned in the same plane as the semiconductor substrate.

In an embodiment in accordance with the present invention, the apparatus may comprise a plurality of point sources, each point source provided along a parallel straight line on or near the axis of revolution and each generating an irradiation beam projected on the semiconductor substrate, each irradiation beam contributing to the straight line projection. By using multiple point sources along a parallel straight line on or near the axis of revolution, the uniformity of the straight line projection may be enhanced. Further, the length of the straight line projection may be increased. Additionally, also the intensity of the irradiation beam on the semiconductor substrate may be increased.

Figure 3:
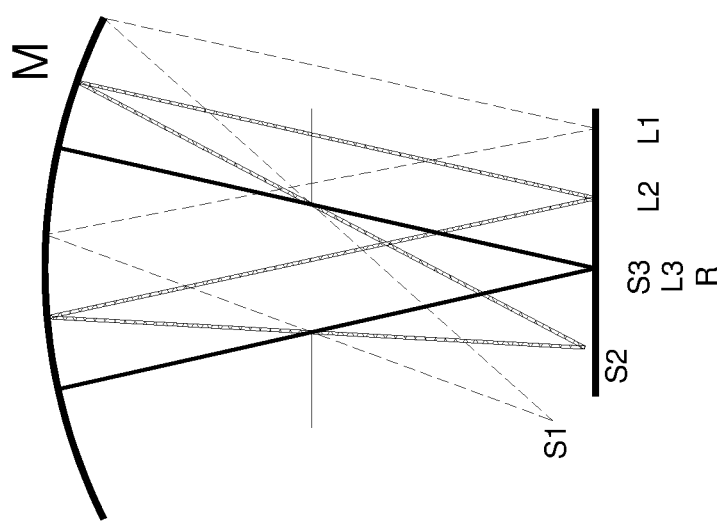
Figure 4:
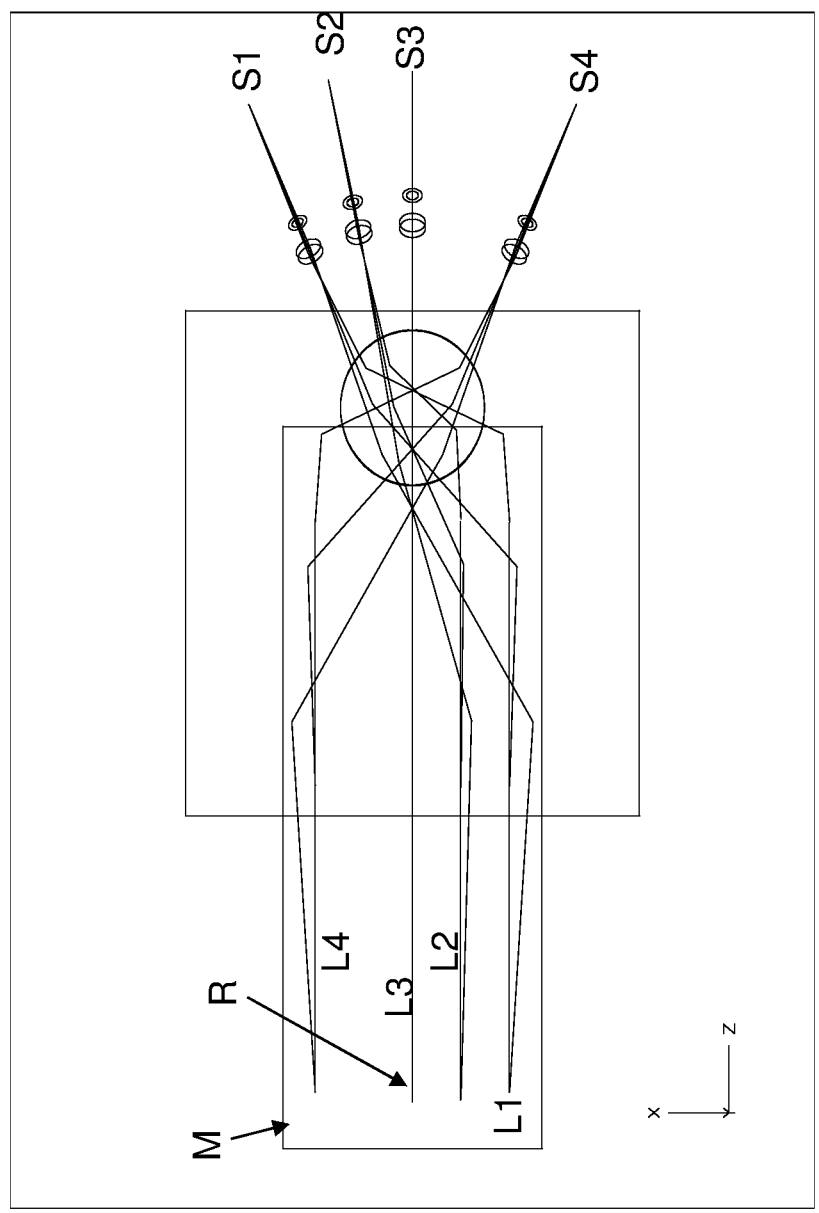

In an alternative embodiment in accordance with the present invention and illustrated in FIG. 3 (cross-sectional view) and FIG. 4 (top view), the apparatus may comprise a plurality of point sources (S1, S2, S3, S4), each point source provided along a line intersecting with the axis of revolution and each generating an irradiation beam projected on the semiconductor substrate, each irradiation beam contributing to a number of parallel line projections (L1, L2, L3, L4). In this case each point source generates an irradiation beam which will be projected on or parallel with the axis of revolution (R). Such line intersecting with the axis of revolution may be straight or curved.

A combination of a plurality of point sources provided along a parallel straight line on or near the axis of revolution and a plurality of point sources provided along a straight or curved line intersecting with the axis of revolution is also possible. In that case, a number of parallel straight lines will be projected wherein to each line several point sources contribute.

Such a plurality of point sources may be generated by a means for generating the plurality of point sources from one point source. Obviously, simultaneously irradiating a plurality of straight line shaped regions by one sufficiently powerful point source offers advantages with respect to process uniformity, production speed and production cost.

Figure 5:
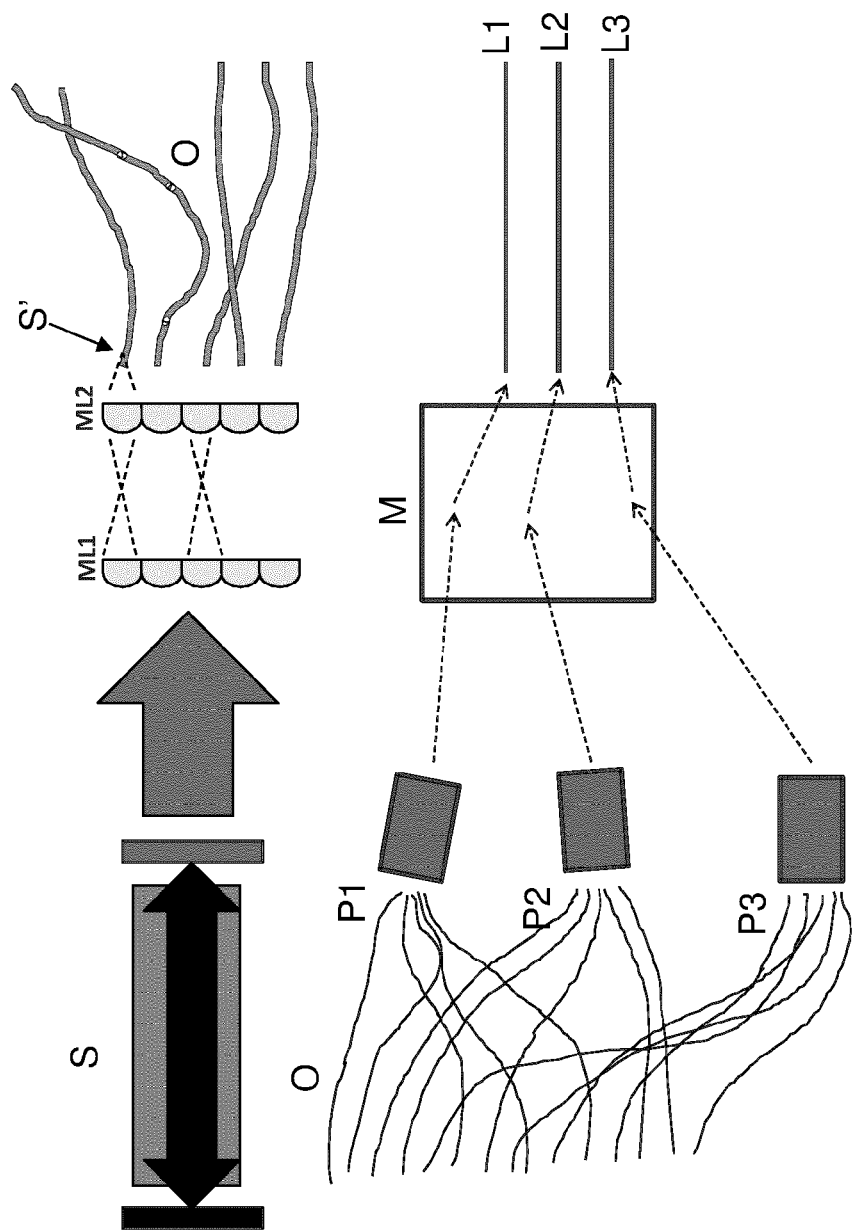

In accordance with the present invention and as illustrated in FIG. 5, such means for generating the plurality of point sources from one point source may comprise one or more arrays of micro-lenses (ML1, ML2) positioned between the point source (S) and the curved mirror (M). The array(s) of micro-lenses will divide the point source into a plurality of point sources (S') each generating an irradiation beam.

Alternatively or in combination with an array of micro-lenses, such means for generating the plurality of point sources from one point source may comprise a plurality of optical fibers (O), each fiber receiving a single irradiation beam and forming a point source provided on or near the axis of revolution. In case the plurality of optical fibers is used in combination with an array of micro-lenses, each fiber receives a single irradiation beam from a single micro-lense. Additionally, at the exit of each fiber or a group of fibers, an imaging system (P1, P2, P3) projecting each of the point sources (S') on the curved mirror may be used.

An apparatus in accordance with the present invention comprising a plurality of point sources may simultaneously generate up to 20, up to 40, up to 60, even up to 75 parallel straight line projections on the semiconductor substrate. Such apparatus may be extremely useful for manufacturing a selective emitter grid in photovoltaics.

Further, an apparatus according to the present invention may comprise a means for reducing the width of the straight line projection, allowing tuning the straight line projection width as desired.

The semiconductor substrate may be of any material suitable for semiconductor or photovoltaic applications such as, but not limited to crystalline silicon, undoped silicon or doped silicon, polycrystalline silicon, implanted silicon, silicon carbide, amorphous silicon, silicon germanium, III-V compound semiconductors such as gallium arsenide, gallium aluminum arsenide, gallium nitride, II-VI compound semiconductors like cadmium telluride, copper indium diselenide (CuInSe2) or copper indium gallium diselenide (Cu(In,Ga)Se2) and the like, multi-junction semiconductor stacks, and the like.

EXAMPLE as illustrated in FIG. 5:

The laser beam (typically 10×6 cm) is split into p×q (example 9×13) sub beams by two micro lens arrays ML1 and ML2 arranged in such way that each micro lens in ML2 forms the image of a corresponding micro-lens in ML1 on the entrance face of an optical fiber as shown in FIG. 5. The advantage of forming such image versus injecting directly the light into the optical fiber by placing the entrance of the optical fiber at the focal point of ML1 is to minimize the peak energy density and thus reducing the risk of damage of the optical fiber.

The output of the optical fibers will be arranged to form the secondary sources mentioned above. If the number of straight lines N to be formed is equal to 9 and the number of optical fibers is p×q=9×13=117, the 117 fiber outputs will be arranged in 9 groups of 13, each group of 13 positioned to form one of the 9 straight lines on the sample plane.

A cylindrical mirror projects the light outputs of the say 117 sources to form 9 parallel straight lines, each one form from 13 fiber outputs.

A plane mirror will be added for practical purpose as discussed above and shown on FIG. 2 in order to avoid positioning the fiber outputs on the sample plane.

The arrangement and exact number of fibers within the 9 groups can be chosen in order to balance the energy among the 9 groups, thus forming 9 straight lines of equal energy. For example, if the laser beam at the entrance of the micro lens array is not homogeneous, fibers will be arranged to compensate for such in-homogeneities.

The cylindrical mirror forms an optical system of magnification=1. This means that the width of the lines formed will be equal to the core diameter of the optical fiber.

However, due to availability and to minimize the number of fibers, the fiber core diameter should be chosen between 0.5-1 mm. Since a line width of 200-300 µm is required, an optical imaging system has to be used for each group of 13 fiber outputs to reduce the width of the line from the say 1 mm fiber core size to the say 200 µm desired line width. This optical system can be a single lens or, preferably (to reduce energy density on the lens) m lenses tightly packed (for example hexagonal lenses that can be packed tightly).

The invention claimed is:

1. An apparatus for irradiating a semiconductor substrate comprising:
   (a) a curved mirror with a reflective surface of revolution; and
   (b) a point source generating an irradiation beam being incident on the curved mirror along an incident direction,
   the curved mirror and the point source forming a system having an axis of revolution wherein the point source is provided on or near said axis of revolution, and said axis of revolution substantially coinciding with a straight line projection to be generated on a semiconductor substrate,
   wherein the straight line projection to be generated has a specific length, and wherein a normal to a center point of the reflective surface of revolution forms an angle with the incident direction, said angle selectable such that the irradiation beam is projected on the semiconductor substrate forming the straight line projection having said specific length.

2. The apparatus for irradiating a semiconductor substrate according to claim 1, wherein the curved mirror is a concave mirror.

3. The apparatus for irradiating a semiconductor substrate according to claim 2, wherein the concave mirror is cylindrical, conical or spherical.

4. The apparatus for irradiating a semiconductor substrate according to claim 3, comprising a folding mirror for projecting the point source on or near the axis of revolution.

5. The apparatus for irradiating a semiconductor substrate according to claim 4, comprising a plurality of point sources, each point source provided along a parallel straight line on or near the axis of revolution and each generating an irradiation beam projected on the semiconductor substrate, each irradiation beam contributing to the straight line projection.

6. The apparatus for irradiating a semiconductor substrate according to claim 4, comprising a plurality of point sources, each point source provided along a line intersecting with the axis of revolution and each generating an irradiation beam projected on the semiconductor substrate, each irradiation beam contributing to a number of parallel straight line projections.

7. The apparatus for irradiating a semiconductor substrate according to claim 5, comprising a means for generating the plurality of point sources from one irradiation source.

8. The apparatus for irradiating a semiconductor substrate according to claim 7, wherein the means for generating the plurality of point sources comprises an array of micro-lenses positioned between the irradiation source and the curved mirror.

9. The apparatus for irradiating a semiconductor substrate according to claim 7, wherein the means for generating the plurality of point sources additionally comprise a plurality of optical fibers, each fiber receiving a single irradiation beam from a micro-lens and forming a point source provided on or near the axis of revolution.

10. The apparatus for irradiating a semiconductor substrate according to claim 9, additionally comprising a means for reducing the width of the straight line projection.

11. A method of use of an apparatus for irradiating a semiconductor substrate, the method comprising the steps of:
using said apparatus, wherein said device has
(a) a curved mirror with a reflective surface of revolution; and
(b) a point source generating an irradiation beam being incident on the curved mirror along an incident direction;
the curved mirror and the point source forming a system having an axis of revolution wherein the point source is provided on or near said axis of revolution, and said axis of revolution substantially coinciding with a straight line projection to be generated on a semiconductor substrate, wherein the straight line projection to be generated has a specific length, and wherein a normal to a center point of the reflective surface of revolution forms an angle with the incident direction, said angle being selectable such that the irradiation beam is projected on the semiconductor substrate forming the straight line projection having said specific length; and
generating at least one straight line projection on said semiconductor substrate using said apparatus including selecting said angle such that the irradiation beam projected on the semiconductor substrate forms the straight line projection having said specific length.

12. The apparatus for irradiating a semiconductor substrate according to claim 1, wherein the curved mirror is a concave mirror and the concave mirror is cylindrical, conical or spherical.

13. The apparatus for irradiating a semiconductor substrate according to claim 1, comprising a folding mirror for projecting the point source on or near the axis of revolution.

14. The apparatus for irradiating a semiconductor substrate according to claim 6, comprising a means for generating the plurality of point sources from one irradiation source.

15. The apparatus for irradiating a semiconductor substrate according to claim 8, wherein the means for generating the plurality of point sources additionally comprise a plurality of optical fibers, each fiber receiving a single irradiation beam from a micro-lens and forming a point source provided on or near the axis of revolution.

16. The apparatus for irradiating a semiconductor substrate according to claim 15, additionally comprising a means for reducing the width of the straight line projection.

17. The method according to claim 11, comprising simultaneously generating at least two and up to 20 parallel straight line projections on the semiconductor substrate.

18. The method according to claim 11, further comprising manufacturing a selective emitter grid.

19. The method according to claim 11, further comprising irradiating a large area semiconductor surface in a scanning movement.

20. An apparatus for irradiating a semiconductor substrate comprising:
(a) a curved mirror with a reflective surface of revolution; and
(b) a single point source generating an irradiation beam being incident on the curved mirror along an incident direction,
the curved mirror and the point source forming a system having an axis of revolution wherein the single point source is provided on or near said axis of revolution, and said axis of revolution substantially coinciding with a continuous straight line projection to be generated on a semiconductor substrate,
wherein the continuous straight line projection to be generated has a specific length, and
wherein a normal to a center point of the reflective surface of revolution forms an adjustable angle with the incident direction such that the irradiation beam is projected on the semiconductor substrate forming the continuous straight line projection having said specific length, and adjustment of said angle adjusts the length of the continuous straight line projection.

\* \* \* \* \*